(12) United States Patent
Huh et al.

(10) Patent No.: US 8,685,768 B2
(45) Date of Patent: Apr. 1, 2014

(54) ORGANIC LIGHT EMITTING DIODES AND METHODS OF MANUFACTURING THE SAME

(75) Inventors: Jin Woo Huh, Daejeon (KR); Jeong Ik Lee, Gunpo-si (KR); Chul Woong Joo, Seoul (KR); Doo-Hee Cho, Daejeon (KR); Jin Wook Shin, Incheon (KR); Jaehyun Moon, Seoul (KR); Jun-Han Han, Daejeon (KR); Joo Hyun Hwang, Seoul (KR); Hye Yong Chu, Daejeon (KR); Byoung Gon Yu, Yeongdong-gun (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/494,532

(22) Filed: Jun. 12, 2012

(65) Prior Publication Data

US 2013/0056711 A1    Mar. 7, 2013

(30) Foreign Application Priority Data

Sep. 6, 2011    (KR) .................... 10-2011-0090366

(51) Int. Cl.
*H01L 21/00* (2006.01)
(52) U.S. Cl.
USPC ............... 438/29; 438/99; 257/98; 257/40; 257/E33.074; 257/E51.026

(58) Field of Classification Search
USPC ......... 257/98, 40, E33.074, E51.026; 438/29, 438/99
See application file for complete search history.

(56) References Cited

U.S. PATENT DOCUMENTS

| | | | |
|---|---|---|---|
| 7,255,906 | B2 | 8/2007 | Doi et al. |
| 7,750,559 | B2 | 7/2010 | Furugori |
| 7,750,564 | B2 | 7/2010 | Lee et al. |
| 2004/0012980 | A1* | 1/2004 | Sugiura et al. ............... 362/560 |
| 2004/0241421 | A1 | 12/2004 | Ootsuka et al. |
| 2004/0263061 | A1 | 12/2004 | Ishikawa et al. |
| 2010/0203235 | A1* | 8/2010 | Verschuuren et al. .......... 427/66 |

FOREIGN PATENT DOCUMENTS

| | | |
|---|---|---|
| KR | 10-2004-0030888 A | 4/2004 |
| KR | 10-0593796 B1 | 6/2006 |
| KR | 10-0636579 B1 | 10/2006 |
| KR | 10-2008-0050899 A | 6/2008 |
| KR | 10-0914029 B1 | 8/2009 |
| KR | 10-1117934 B1 | 2/2012 |

\* cited by examiner

*Primary Examiner* — Tu-Tu Ho
(74) *Attorney, Agent, or Firm* — Rabin & Berdo, P.C.

(57) ABSTRACT

The inventive concept provides organic light emitting diodes and methods of manufacturing an organic light emitting diode. The organic light emitting diode includes a substrate, a first electrode layer and a second electrode layer formed on the substrate, an organic light emitting layer disposed between the first electrode layer and the second electrode layer and generating light, and a scattering layer between the first electrode layer and the substrate or between the first electrode layer and the organic light emitting layer. The scattering layer scatters the light.

8 Claims, 15 Drawing Sheets

ORGANIC LIGHT EMITTING DIODES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2011-0090366, filed on Sep. 6, 2011, the entirety of which is incorporated by reference herein.

BACKGROUND

The inventive concept relates to light emitting devices and methods of manufacturing the same and, more particularly, to organic light emitting diodes and methods of manufacturing the same.

Recently, a display industry may have been developed for satisfying demands of small size, lightness, thinness, and high resolution of display devices. For example, organic light emitting diodes (OLEDs) are attractive in next generation-flat panel display devices and next generation-illumination market. The organic light emitting diodes may have excellent display characteristics such as wide view angle, fast response speed, thin thickness, low manufacturing costs, and high contrast.

The organic light emitting diode may correspond to a self-emitting device which electrically excites an organic light emitting material to emit light. The organic light emitting diode may include a substrate, a first electrode, a second electrode, and an organic light emitting layer formed between the first and second electrodes. The organic light emitting layer may generate light by recombination of holes and electrons supplied from the first and second electrodes. The organic light emitting diode may output various colors of light according to kinds of materials constituting the organic light emitting layer. However, a conventional organic light emitting diode may have a scattering layer between the organic light emitting layer and the first electrode or between the first electrode and the substrate. A guided mode loss may occur in the organic light emitting diode having the scattering layer, such that light extraction efficiency of the organic light emitting diode may decrease.

SUMMARY

Embodiments of the inventive concept may provide organic light emitting diodes capable of increasing or maximize light extraction efficiency and methods of manufacturing the same.

Embodiments of the inventive concept may also provide organic light emitting diodes capable of increasing or maximize productivity and methods of manufacturing the same.

In one aspect, an organic light emitting diode may include: a substrate; a first electrode layer and a second electrode layer formed on the substrate; an organic light emitting layer between the first electrode layer and the second electrode layer, the organic light emitting layer generating light; and a scattering layer between the first electrode layer and the substrate or between the first electrode layer and the organic light emitting layer, the scattering layer scattering the light.

In some embodiments, the scattering layer may include fine patterns.

In other embodiments, the substrate may include a recess formed at a top surface thereof. Here, the fine patterns may be disposed along an inner surface of the recess.

In still other embodiments, the recess may have a micro lens-shape.

In yet other embodiments, the fine patterns may include polymer.

In yet still other embodiments, the polymer may include at least one of polystyrene, polybutadiene, polybutylacrylate, polyisoprene, polyhexylacrylate, polyisobutylene, polybutylmethacrylate, polyethylethylene, polyvinylpyridine, and polyethyleneoxide.

In yet still other embodiments, each of the fine patterns may have a width within a range of about 100 nm to about 700 nm.

In yet still other embodiments, the fine patterns may correspond to concave-convex parts formed at a top surface of the substrate.

In yet still other embodiments, the scattering layer may further include a planarization layer covering the fine patterns.

In yet still other embodiments, the planarization layer may include at least one of inorganic materials of $TiO_2$, $ZrO_2$, ZnS, $TiO_2$—$SiO_2$, $SnO_2$, and $In_2O_3$, polymers of polyvinyl phenolic resin, epoxy resin, polyimide resin, polystyrene resin, polycarbonate resin, polyethylene resin, polymethylmethacrylate (PMMA) resin, and polypropylene resin, and any combination thereof.

In another aspect, a method of manufacturing an organic light emitting diode may include: preparing a substrate; forming a scattering layer on the substrate; forming a first electrode layer on the scattering layer; forming an organic light emitting layer on the first electrode layer; and forming a second electrode layer on the organic light emitting layer.

In some embodiments, forming the scattering layer may include: forming fine patterns on the substrate; and forming a planarization layer covering the fine patterns.

In other embodiments, forming the fine patterns may include: forming a polymer layer on the substrate; rearranging the polymer layer into first polymer blocks and second polymer blocks by a phase separation method; and removing the first polymer blocks or the second polymer blocks.

In still other embodiments, the polymer layer may include block copolymer formed by a spin coating method.

In yet other embodiments, the block copolymer may include at least one of polystyrene-polymethylmethacrylate copolymer, polybutadiene-polybutylmethacrylate copolymer, polybutadiene-polydimethylsiloxane copolymer, polybutadiene-polymethylmethacrylate copolymer, polybutadiene-polyvinylpyridine copolymer, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polyisobutylene-polybutylmethacrylate, polyisobutylene-polydimethylsiloxane, polybutylmethacrylate-polybutylacrylate, polyethylethylene-polymethylmethacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polyvinylpyridine, polyvinylpyridine-polymethylmethacrylate, polyethyleneoxide-polyisoprene, polyethylene-oxidepolybutadiene, polyethyleneoxide-polystyrene, polyethyleneoxide-polymethylmethacrylate, polyethyleneoxide-polydimethylsiloxane, and polystyrene-polyethyleneoxide.

In yet still other embodiments, the block copolymer may be rearranged into the first polymer blocks and the second polymer blocks by a thermal treatment. The phase separation method may include the thermal treatment.

In yet still other embodiments, the first polymer blocks or the second polymer blocks may be removed by a cleaning solution after the first and second polymer blocks are exposed by ultraviolet rays.

In yet still other embodiments, forming the fine patterns may include: etching the substrate exposed from the first polymer blocks or the second polymer blocks which remain on the substrate.

In yet still other embodiments, the planarization layer may include at least one of inorganic materials of $TiO_2$, $ZrO_2$, ZnS, $TiO_2$—$SiO_2$, $SnO_2$, and $In_2O_3$, polymers of polyvinyl phenolic resin, epoxy resin, polyimide resin, polystyrene resin, polycarbonate resin, polyethylene resin, polymethylmethacrylate (PMMA) resin, and polypropylene resin, and any combination thereof. The planarization layer may be formed by a spin coating method.

In yet still other embodiments, preparing the substrate may include: forming recesses at a top surface of the substrate.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
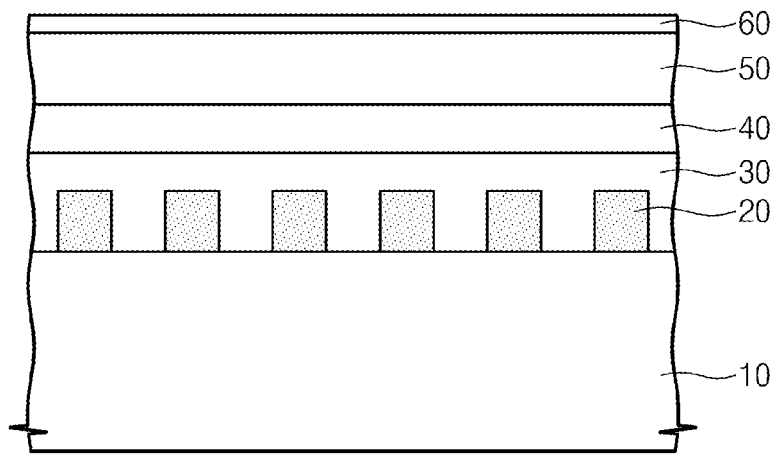
FIG. 1 is a cross-sectional view illustrating an organic light emitting diode according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a cross-sectional view illustrating an organic light emitting diode according to a first embodiment of the inventive concept.

Referring to FIG. 1, an organic light emitting diode according to a first embodiment may include a fine patterns 20 formed between a substrate 10 and a first electrode layer 40. The substrate 10 may be formed of a transparent material such as a glass or a plastic. Each of the fine patterns 20 may have a size of a visible light wavelength band (e.g., about $10^2$ nm). The fine patterns 20 may be disposed on the substrate 10 randomly (e.g., non-periodicity). The fine patterns 20 may include at least one polymer selected from a group consisting of polystyrene, polybutadiene, polybutylacrylate, polyisoprene, polyhexylacrylate, polyisobutylene, polybutylmethacrylate, polyethylethylene, polyvinylpyridine, and polyethyleneoxide. The fine patterns 20 may be disposed in a planarization layer 30 and increase scattering of light. The planarization layer 30 covers the fine patterns 20. For example, the planarization layer 30 may include a transparent material including at least one of silicon oxide (e.g., spin-on-glass (SOG)), titanium oxide ($TiO_2$), and tantalum oxide ($Ta_2O_5$). The planarization layer 30 may have a refractive index higher than those of an organic light emitting layer 50 and the first electrode layer 40. The planarization layer 30 may increase light extraction efficiency in the organic light emitting layer 50 and the first electrode layer 40. The planarization layer 30 and the fine patterns 20 may constitute a scattering layer.

Thus, the organic light emitting diode according to the first embodiment of the inventive concept may increase or maximize the light extraction efficiency by light scattering.

The first electrode layer 40 may be formed of a conductive material having a transparency. For example, the first electrode layer 40 may include at least one of transparent conductive oxides (TCOs). In more detail, the first electrode layer 40 may include indium tin oxide (ITO) or indium zinc oxide (IZO). Additionally, the first electrode layer 40 may include graphene having a thickness within a range of about 1 nm to about 10 nm.

The organic light emitting layer 50 may include an organic light emitting material. For example, the organic light emitting layer 50 include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and carbazole. Additionally, the organic light emitting layer 50 may include an organic light emitting material including dopants. For example, the dopants may include at least one of xanthene, perylene, cumarine, rhodamine, rubrene, dicyanomethylenepyran, thiopyran, (thia)pyrilium, periflanthene derivatives, indenoperylene derivatives, carbostyryl, nile red, and quinacridone.

The organic light emitting layer 50 may have a single-layered structure, or a multi-layered structure including an assistant layer. In other words, the organic light emitting layer 50 may include at least one layer including at least one of the organic light emitting materials described above, and the assistant layer increasing light emitting efficiency of the organic light emitting layer 50. The assistant layer may include at least one of a hole injecting layer, a hole transfer layer, an electron transfer layer, and an electron injecting layer. The organic light emitting layer 50 may generate light by recombination of holes and/or electrons supplied from the first electrode layer 40 and/or a second electrode layer 60.

The second electrode layer 60 may include a conductive material. For example, the second electrode layer 60 may include at least one of aluminum (Al), silver (Ag), magnesium (Mg), and molybdenum (Mo). Additionally, the second electrode layer 60 may include a transparent conductive material. The second electrode layer 60 may be applied with a voltage from an external system, so that the second electrode layer 60 may apply electrons into the organic light emitting layer 50. The second electrode layer 60 may transmit the light generated from the organic light emitting layer 50 or reflect the light toward the first electrode layer 40. Even though not shown in the drawings, a passivation layer may be disposed on the second electrode layer 60.

A method of manufacturing the organic light emitting diode described above will be described hereinafter.

FIGS. 2A to 2F are cross-sectional views illustrating a method of manufacturing an organic light emitting diode according to a first embodiment of the inventive concept.

Figure 2A:
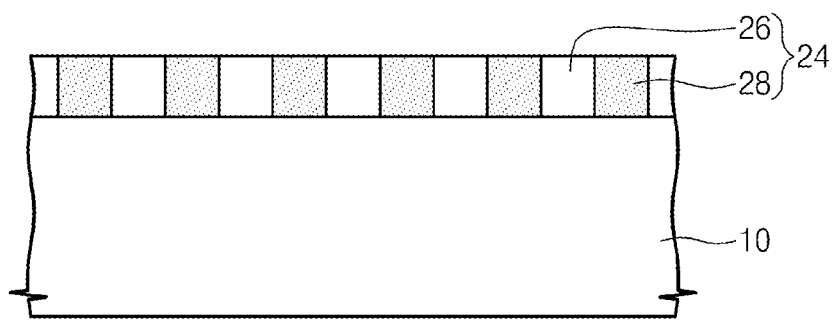
FIGS. 2A to 2F are cross-sectional views illustrating a method of manufacturing an organic light emitting diode according to a first embodiment of the inventive concept.

Referring to FIG. 2A, a polymer layer 24 is formed on a substrate 10. The polymer layer 24 may be formed on the substrate 10 by a spin coating method. The polymer layer 24 may include a block copolymer consisting of a first polymer block 26 and a second polymer block 28. The first polymer block 26 and the second polymer block 28 may be covalently bonded to each other in a volume ratio of 1:1. The block copolymer may be formed of linear type or branched type polymer having a molecular weight within a range of about 3,000 g/mol to 2,000,000 g/mol. For example, the block copolymer may include at least one of polystyrene-polymethylmethacrylate copolymer, polybutadiene-polybutylmethacrylate copolymer, polybutadiene-polydimethylsiloxane copolymer, polybutadiene-polymethylmethacrylate copolymer, polybutadiene-polyvinylpyridine copolymer, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polyisobutylene-polybutylmethacrylate, polyisobutylene-polydimethylsiloxane, polybutylmethacrylate-polybutylacrylate, polyethylethylene-polymethylmethacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, polyethyleneoxide-polymethylmethacrylate, polyethyleneoxide-polydimethylsiloxane, and polystyrene-polyethyleneoxide. However, the inventive concept is not limited thereto. In other embodiments, various other block polymers may be used as the polymer layer 24. The polymer layer 24 may include a first homo polymer and a second homo polymer constituted by the same repeating units as the first polymer block 26 and the second polymer block 28, respectively.

The polymer layer 24 may be rearranged into the first polymer blocks 26 and the second polymer blocks 28 phase-separated from each other by a phase separation method. Polarities of the first polymer block 26 and the second polymer block 28 may be different from each other according to repeating unit structures constituting the first and second polymer blocks 26 and 28. The polymer layer 24 may be divided into the first polymer blocks 24 and the second polymer blocks 26 to be rearranged at a temperature higher than a glass transition temperature (Tg) of the block copolymer. The phase separation method of the polymer layer 24 may include a self-assembled method using a thermal treatment. For example, when the polymer layer 24 of polystyrene-polymethylmethacrylate copolymer is thermally treated at about 200 degrees Celsius under argon (Ar) atmosphere, the polymer layer 24 may be divided into the first polymer blocks 26 of polystyrene and the second polymer blocks 28 of polymethylmethacrylate to be rearranged.

Figure 2B:
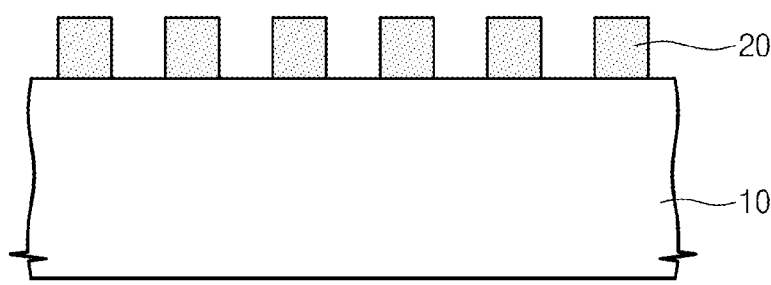

Referring to FIG. 2B, one of the first polymer block 26 and the second polymer block 28 may be removed to form fine patterns 20 consisting of the other of the first and second polymer blocks 26 an 28 which remains. The fine patterns 20 may expose portions of the substrate 10. One of the first and second polymer blocks 26 and 28 may be stripped by a cleaning solution after exposure of ultraviolet rays or may be selectively removed by a solvent. For example, polymethylmethacrylate may be exposed by the ultraviolet rays so as to be phase-separated from polystyrene. The polymethylmethacrylate may be dissolved in toluene or acetic acid. An ultrasonic wave may accelerate the removal of the polymethylmethacrylate. The first polymer block 26 or the second polymer block 28 remaining on the substrate 10 may be thermally treated. As illustrated in FIG. 2B, for example, the first polymer blocks 26 may be removed to form the fine patterns 20 formed of the second polymer blocks 28. However, the inventive concept is not limited thereto. In other embodiments, the second polymer blocks 28 may be removed to form the fine patterns 20 formed of the first polymer blocks 26. In this case, it is possible to identically obtain effects according to the inventive concept. Thus, it is possible to increase or maximize productivity by the method of manufacturing the organic light emitting diode according to the first embodiment of the inventive concept.

Figure 2C:
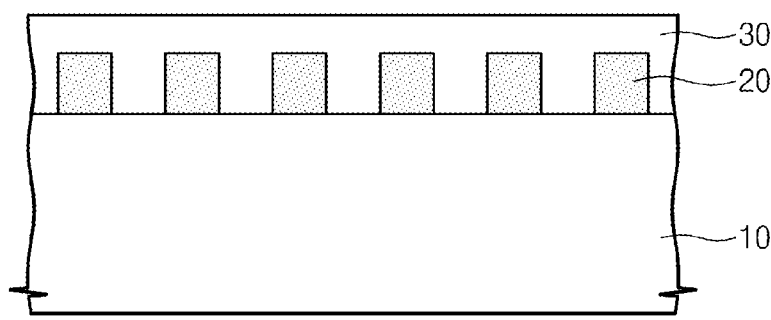

Referring to FIGS. 1 and 2C, a planarization layer 30 is formed to cover the fine patterns 20. The planarization layer 30 may include at least one of inorganic materials (e.g., $TiO_2$, $ZrO_2$, ZnS, $TiO_2$—$SiO_2$, $SnO_2$, and $In_2O_3$), polymers (e.g., polyvinyl phenolic resin, epoxy resin, polyimide resin, polystyrene resin, polycarbonate resin, polyethylene resin, polymethylmethacrylate (PMMA) resin, and polypropylene resin), and any combination thereof. The planarization layer 30 may be formed by a spin coating method.

Figure 2D:
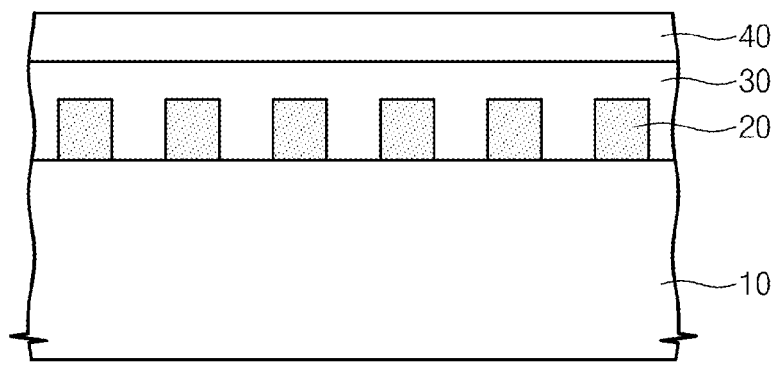
Figure 2E:
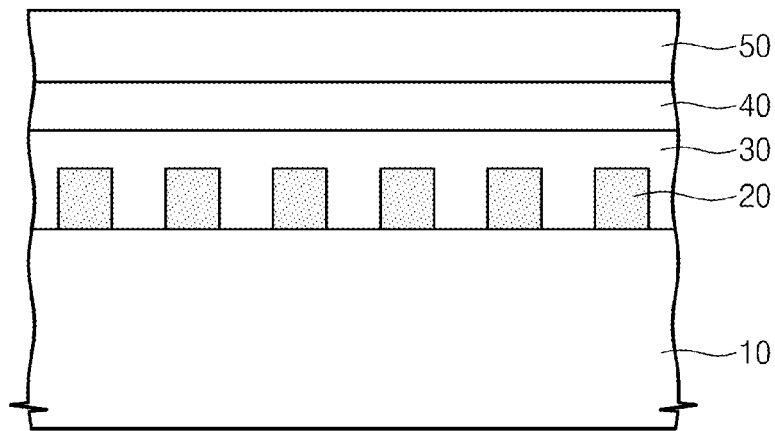
Figure 2F:
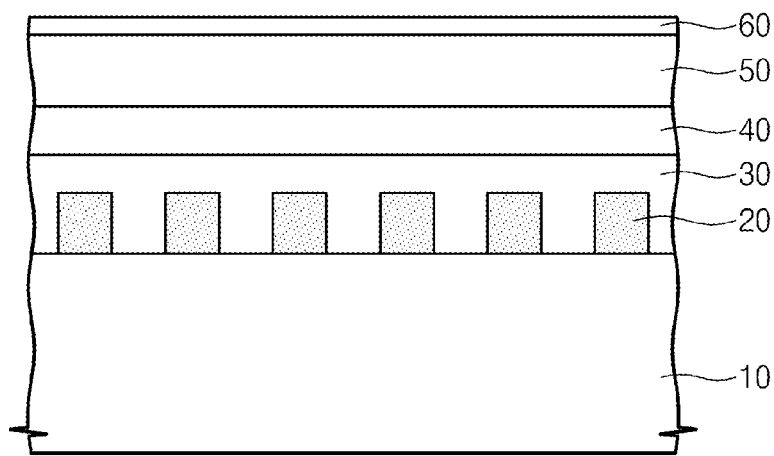

Referring to FIGS. 2D to 2F, a first electrode layer 40, an organic light emitting layer 50, and a second electrode layer 60 sequentially stacked on the planarization layer 30. The first electrode layer 40 and the second electrode layer 60 may be formed by a sputtering method. The first electrode layer 40 may include a transparent conductive material such as indium tin oxide (ITO) or indium zinc oxide (IZO). The second electrode layer 60 may include at least one of gold, silver, tungsten, copper, and aluminum. The organic light emitting layer 50 may be formed by a spin coating method. The organic light emitting layer 50 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and carbazole.

Thus, the method of manufacturing the organic light emitting diode according to the first embodiment may increase or maximize productivity.

Figure 3:
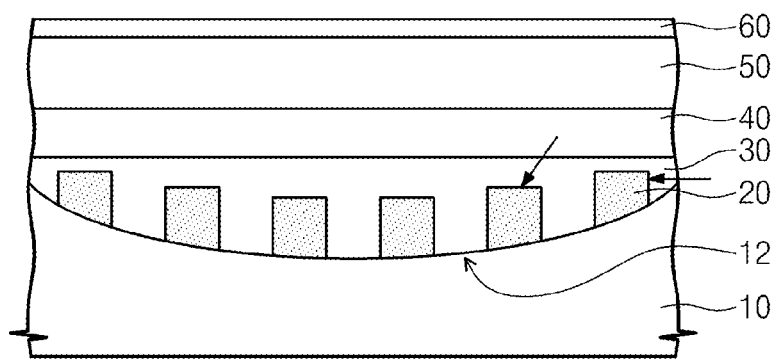
FIG. 3 is a cross-sectional view illustrating an organic light emitting diode according to a second embodiment of the inventive concept.

FIG. 3 is a cross-sectional view illustrating an organic light emitting diode according to a second embodiment of the inventive concept.

Referring to FIG. 3, an organic light emitting diode according to a second embodiment of the inventive concept may include recesses 12 formed in an upper portion of a substrate 10 and fine patterns 20 formed along the recesses 12. The recesses 12 may have micro lens-shapes. The recess 12 may have a width and a depth greater than a width of the fine pattern 20. For example, the recess 12 may have the width within a range of about 1 μm to about 1 mm and the depth within a range of about 1 μm to about 1 mm. The fine pattern 20 may have the width within a range of about 100 nm to about 700 nm. The fine patterns 20 may be disposed along inner surfaces of the recesses 12. The fine patterns 20 may include at least one polymer selected from a group consisting of polystyrene, polybutadiene, polybutylacrylate, polyisoprene, polyhexylacrylate, polyisobutylene, polybutylmethacrylate, polyethylethylene, polyvinylpyridine, and polyethyleneoxide. The recesses 12 and the fine patterns 20 may scatter light proceeding from the organic light emitting layer 50 toward the substrate 10.

Thus, the organic light emitting diode according to the second embodiment of the inventive concept may increase or maximize the light extraction efficiency by light scattering.

FIGS. 4A to 4G are cross-sectional views illustrating a method of manufacturing an organic light emitting diode according to a second embodiment of the inventive concept.

Figure 4A:
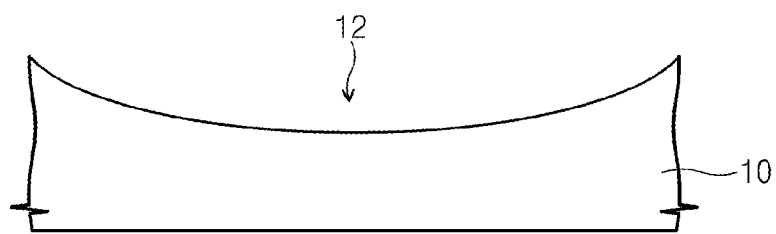
FIGS. 4A to 4G are cross-sectional views illustrating a method of manufacturing an organic light emitting diode according to a second embodiment of the inventive concept.

Referring to FIG. 4A, recesses 12 are formed at an upper surface of a substrate 10. The recesses 12 may be formed by a photolithography process and an etching process. Photoresist patterns may be formed on the substrate 10 by the photolithography process. The etching process may etch a surface of the substrate which is exposed from the photoresist patterns, such that the recesses 12 may be formed in the upper portion of the substrate 10. The etching process may include a wet etching process isotropically etching the surface of the substrate 10. The photoresist patterns may be removed.

Figure 4B:
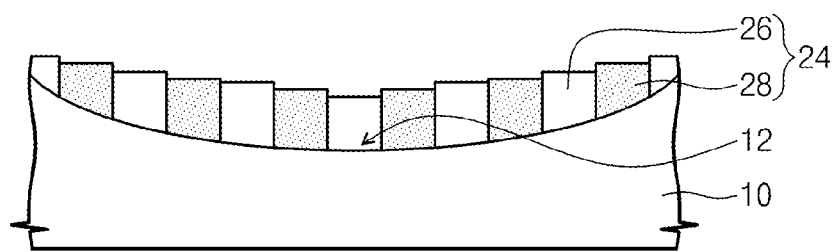

Referring to FIG. 4B, a polymer layer 24 is formed on the recesses 12 of the substrate 10. The polymer layer 24 may include the block copolymer described in the first embodiment. The polymer layer 24 may be divided into first polymer blocks 26 and second polymer blocks 28 to be rearranged at a temperature higher than a glass transition temperature (Tg) of the block copolymer.

Figure 4C:
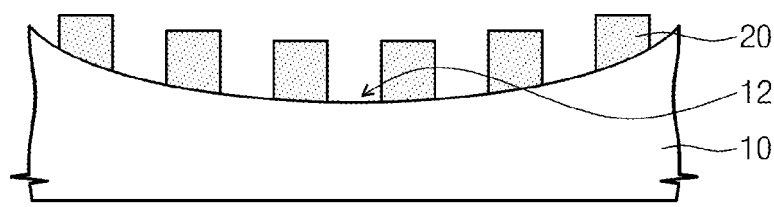

Referring to FIG. 4C, one of the first polymer block 26 and the second polymer block 28 in the polymer layer 24 may be removed to form fine patterns 20 consisting of the other of the first and second polymer blocks 26 and 28 which remains, on the recesses 12. The one of the first and second polymer blocks 26 and 28 may be selectively removed by ultraviolet rays or chemical reaction of a solvent. For example, if polystyrene and polymethylmethacrylate are exposed by the ultraviolet rays, the polymethylmethacrylate may selectively react to the ultraviolet rays. The polymethylmethacrylate reacting to the ultraviolet rays may be removed by a development solution. Alternatively, the polystyrene may be thermally treated and then be formed into the fine patterns 20 remaining on the substrate 10. The fine patterns 20 may be easily formed from the block copolymer without a photolithography process causing high manufacturing cost. Thus, the method of manufacturing the organic light emitting diode according to the second embodiment of the inventive concept may increase or maximize productivity.

Figure 4D:
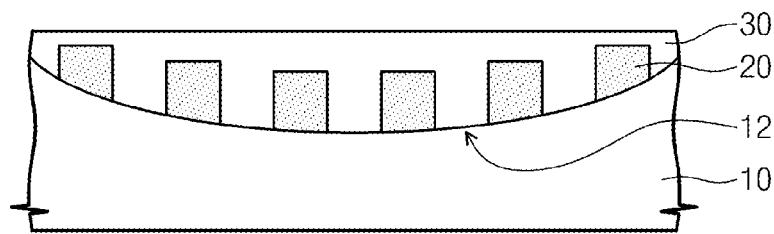

Referring to FIG. 4D, a planarization layer 30 is formed on the recesses 12 and the fine patterns 20. The planarization layer 30 may include at least one of inorganic materials (e.g., $TiO_2$, $ZrO_2$, ZnS, $TiO_2$—$SiO_2$, $SnO_2$, and $In_2O_3$), polymers (e.g., polyvinyl phenolic resin, epoxy resin, polyimide resin, polystyrene resin, polycarbonate resin, polyethylene resin, polymethylmethacrylate (PMMA) resin, and polypropylene resin), and any combination thereof. The planarization layer 30 may be formed by a spin coating method.

Figure 4E:
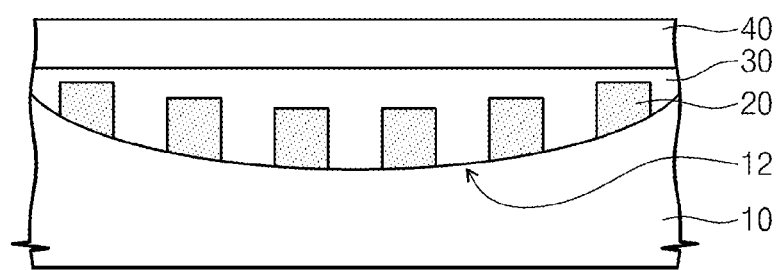
Figure 4F:
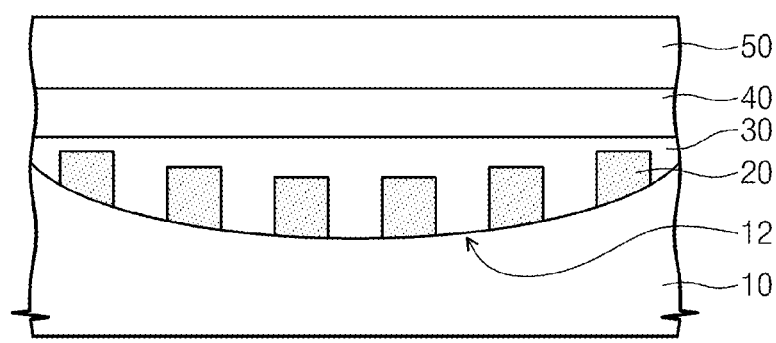
Figure 4G:
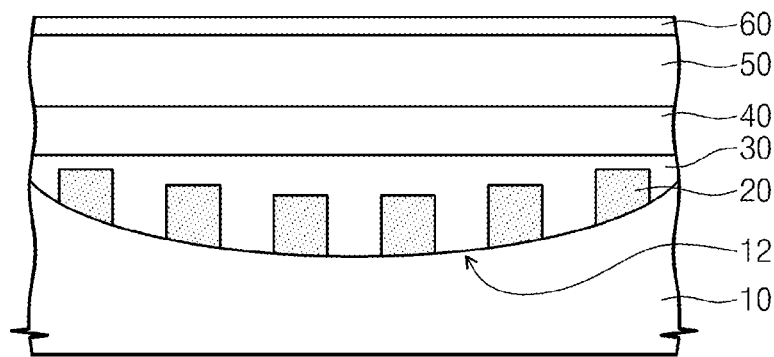

Referring to FIGS. 4E to 4G, a first electrode layer 40, an organic light emitting layer 50, and a second electrode layer 60 are sequentially formed on the planarization layer 30. The first electrode layer 40 and the second electrode 60 may include metals formed by a sputtering method. The organic light emitting layer 50 may be formed by a spin coating method. The organic light emitting layer 50 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and carbazole.

As a result, the method of manufacturing the organic light emitting diode according to the second embodiment may increase or maximize productivity.

Figure 5:
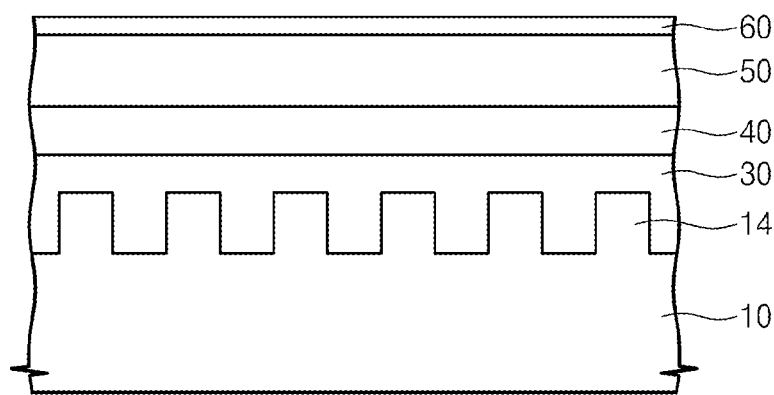
FIG. 5 is a cross-sectional view illustrating an organic light emitting diode according to a third embodiment of the inventive concept.

FIG. 5 is a cross-sectional view illustrating an organic light emitting diode according to a third embodiment of the inventive concept.

Referring to FIG. 5, an organic light emitting diode according to a third embodiment of the inventive concept may include concave-convex parts 14 formed along a top surface of the substrate 10. The concave-convex parts 14 may correspond to the fine patterns 20 in the first embodiment. Convex portions of the concave-convex parts 14 may be formed of the same material as the substrate 10. The substrate 10 may include glass or plastic. Each of the convex portions of the concave-convex parts 14 may have a width within a range of about 100 nm to about 700 nm. In more detail, each of the convex portions of the concave-convex parts 14 may have the width within a range of about 400 nm to about 700 nm corresponding to a wavelength band of light. The concave-convex parts 14 may increase scattering of light transmitted into the first electrode layer 40 and the planarization layer 30 from the organic light emitting layer 50.

Thus, the organic light emitting diode according to the third embodiment of the inventive concept may increase or maximize the light extraction efficiency by light scattering.

FIGS. 6A to 6H are cross-sectional views illustrating a method of manufacturing an organic light emitting diode according to a third embodiment of the inventive concept.

Figure 6A:
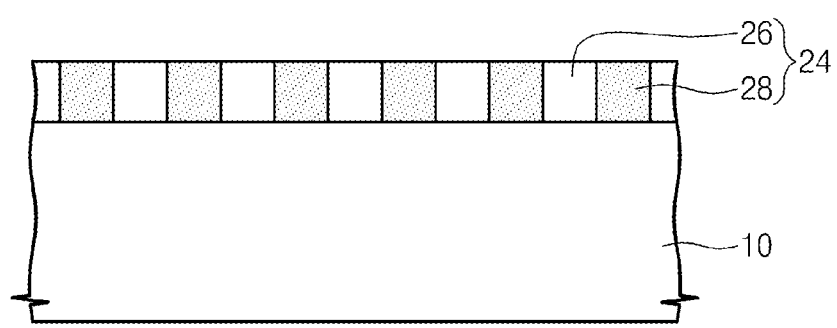
FIGS. 6A to 6H are cross-sectional views illustrating a method of manufacturing an organic light emitting diode according to a third embodiment of the inventive concept.

Referring to FIG. 6A, a polymer layer 24 is formed on a substrate 10. The polymer layer 24 may include block copolymer formed by a spin coating method. The polymer layer 24 may be divided into first polymer blocks 26 and second polymer blocks 28 to be rearranged at a temperature higher than a glass transition temperature (Tg) of the block copolymer.

Figure 6B:
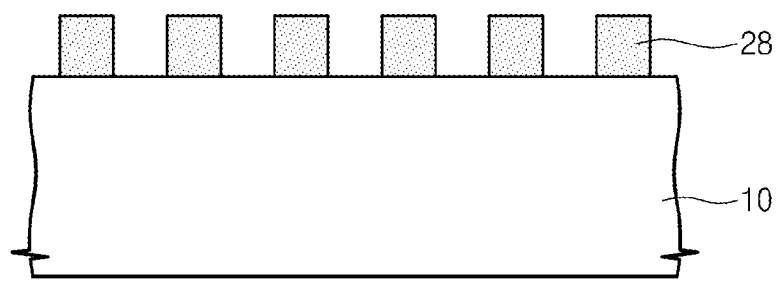

Referring to FIG. 6B, one of the first polymer block 26 and the second polymer block 28 of the polymer layer 24 may be removed. The one of the first and second polymer blocks 26 and 28 may be removed by ultraviolet rays or a chemical reaction of a solvent.

Figure 6C:
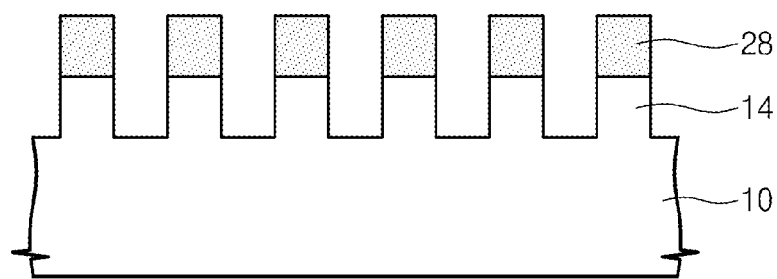
Figure 6D:
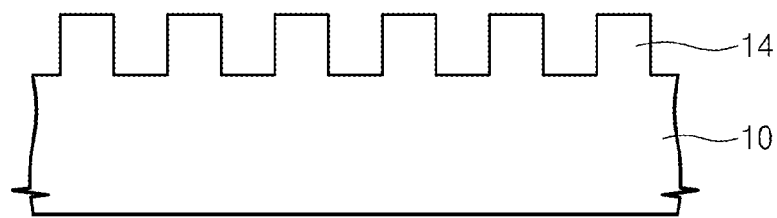

Referring to FIGS. 6C and 6D, a surface of the substrate 10, which may be exposed from the other of the first and second polymer blocks 26 and 28 remaining on the substrate 10, may be etched to form concave-convex part 14. The substrate 10 may be etched by a dry etching method. The first polymer blocks 26 or the second polymer blocks 28 remaining on the substrate 10 may be used as etch masks during the etching process. The concave-convex parts 14 may correspond to fine patterns having widths within a range of about 400 nm to about 700 nm.

Figure 6E:
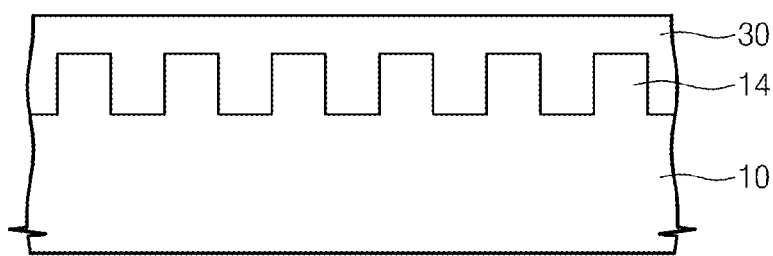

Referring to FIG. 6E, a planarization layer 30 is formed on the concave-convex parts 14. The planarization layer 30 may include at least one of inorganic materials (e.g., $TiO_2$, $ZrO_2$, $ZnS$, $TiO_2$—$SiO_2$, $SnO_2$, and $In_2O_3$), polymers (e.g., polyvinyl phenolic resin, epoxy resin, polyimide resin, polystyrene resin, polycarbonate resin, polyethylene resin, polymethylmethacrylate (PMMA) resin, and polypropylene resin), and any combination thereof. The planarization layer 30 may be formed by a spin coating method.

Figure 6F:
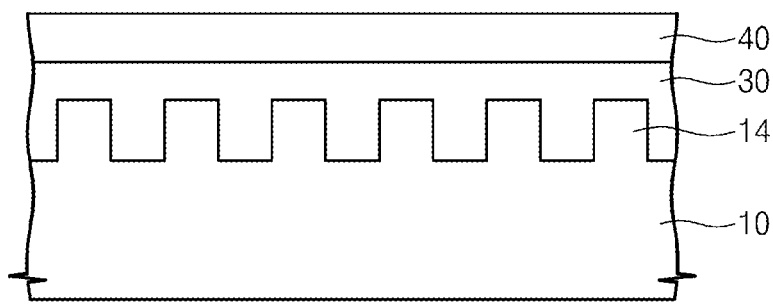
Figure 6G:
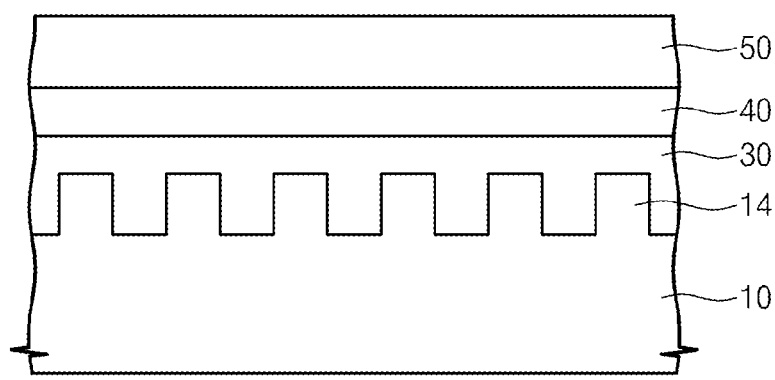
Figure 6H:
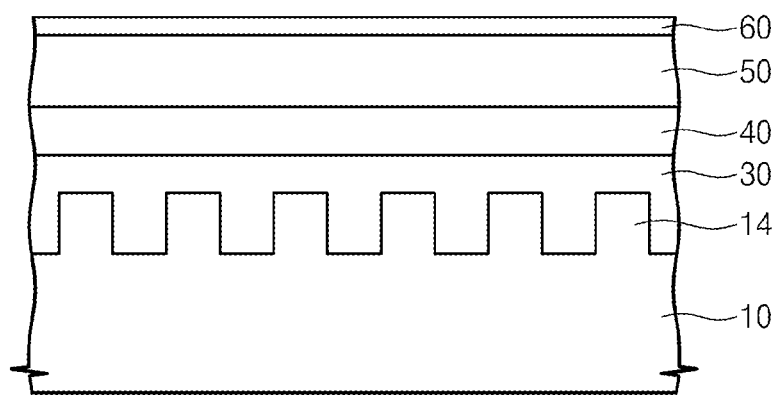

Referring to FIGS. 6F to 6H, a first electrode layer 40, an organic light emitting layer 50, and a second electrode layer 60 are sequentially formed on the planarization layer 30. The first electrode layer 40 and the second electrode 60 may include metals formed by a sputtering method. The organic light emitting layer 50 may be formed by a spin coating method. The organic light emitting layer 50 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and carbazole.

Figure 7:
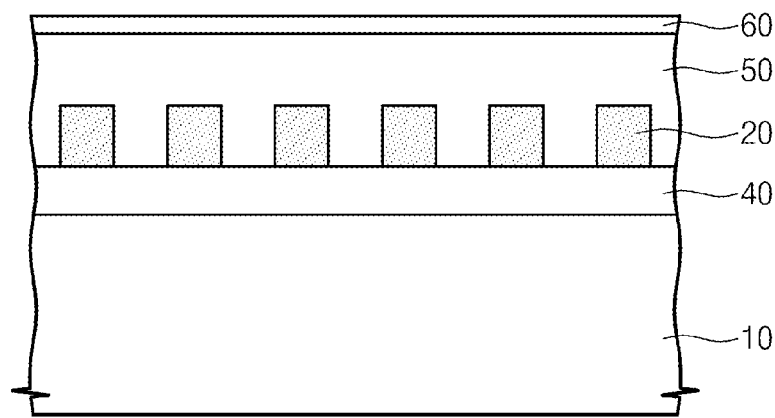
FIG. 7 is a cross-sectional view illustrating an organic light emitting diode according to a fourth embodiment of the inventive concept.

FIG. 7 is a cross-sectional view illustrating an organic light emitting diode according to a fourth embodiment of the inventive concept.

Referring to FIG. 7, an organic light emitting diode according to a fourth embodiment of the inventive concept may include fine patterns 20 formed between a first electrode 40 and an organic light emitting layer 50. The fine patterns 20 may include at least one polymer selected from a group consisting of polystyrene, polybutadiene, polybutylacrylate, polyisoprene, polyhexylacrylate, polyisobutylene, polybutylmethacrylate, polyethylethylene, polyvinylpyridine, and polyethyleneoxide. The light generated from the organic light emitting layer 50 may be scattered by the fine patterns 20.

Thus, the organic light emitting diode according to the fourth embodiment of the inventive concept may increase or maximize the light extraction efficiency by light scattering.

FIGS. 8A to 8E are cross-sectional views illustrating a method of manufacturing an organic light emitting diode according to a fourth embodiment of the inventive concept.

Figure 8A:
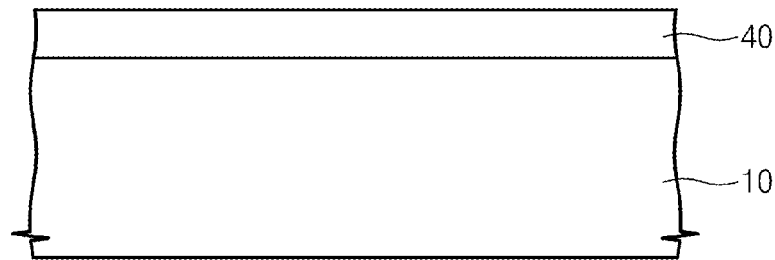
FIGS. 8A to 8E are cross-sectional views illustrating a method of manufacturing an organic light emitting diode according to a fourth embodiment of the inventive concept.

Referring to FIG. 8A, a first electrode layer 40 is formed on a substrate 10. The first electrode layer 40 may include a transparent conductive material such as indium tin oxide (ITO) or indium zinc oxide (IZO) formed by a sputtering method.

Figure 8B:
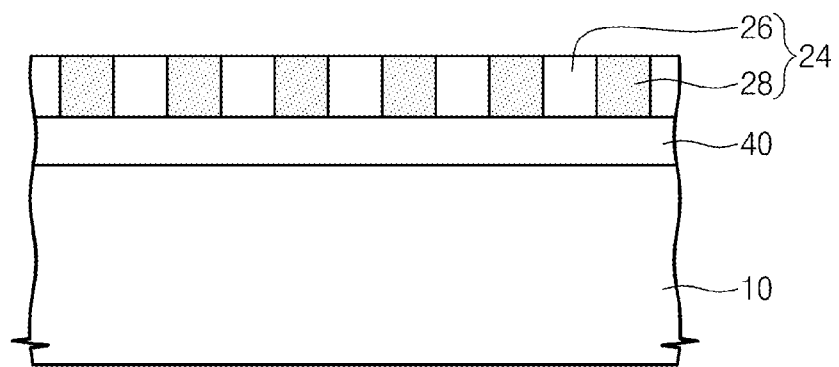

Referring to FIG. 8B, a polymer layer 24 is formed on the first electrode layer 40. The polymer layer 24 may include block copolymer formed by a spin coating method. The polymer layer 24 may be divided into first polymer blocks 26 and second polymer blocks 28 to be rearranged at a temperature higher than a glass transition temperature (Tg) of the block copolymer.

Figure 8C:
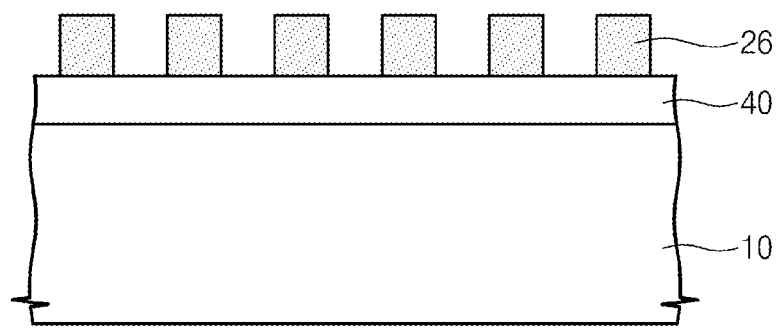

Referring to FIG. 8C, one of the first polymer block 26 and the second polymer block 28 of the polymer layer 24 may be removed to form fine patterns 20 consisting the other thereof. The one of the first and second polymer blocks 26 and 28 may be removed by ultraviolet rays or a chemical reaction of a solvent.

Thus, the method of manufacturing the organic light emitting diode according to embodiments of the inventive concept may increase or maximize productivity.

Figure 8D:
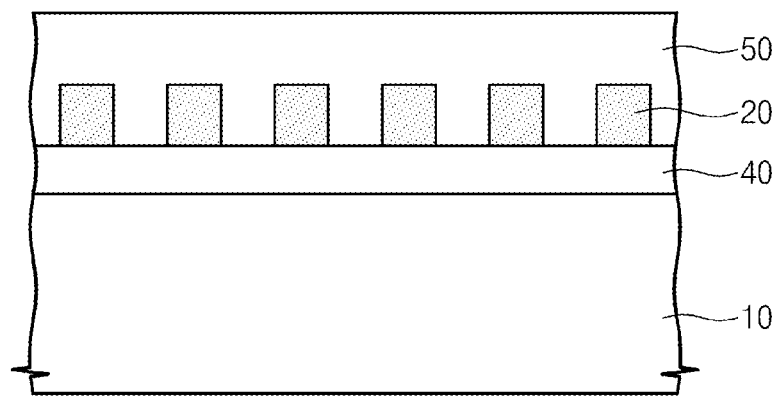

Referring to FIG. 8D, an organic light emitting layer 50 is formed on the fine patterns 20 and the first electrode layer 40. The organic light emitting layer 50 may be formed by a spin coating method. The organic light emitting layer 50 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and carbazole.

Figure 8E:
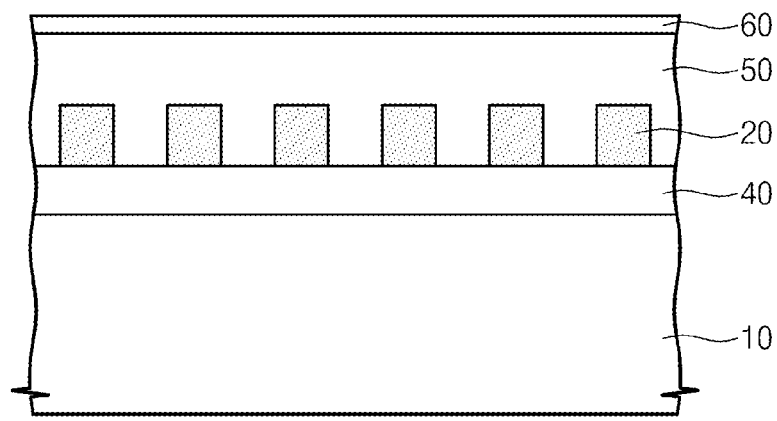

Referring to FIG. 8E, a second electrode layer 60 is formed on the organic light emitting layer 50. The second electrode layer 60 may include at least one of gold, silver, tungsten, copper, and aluminum.

As a result, the method of manufacturing the organic light emitting diode according to embodiments of the inventive concept may increase or maximize productivity.

According to embodiments of the inventive concept, the organic light emitting diode may include a scattering layer including fine patterns formed between the substrate and the first electrode layer or between the first electrode layer and the organic light emitting layer. Additionally, the scattering layer may be formed by a spin coating method. Thus, the organic light emitting diodes and the methods of manufacturing the same may increase or maximize light extraction efficiency by light scattering, and productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of manufacturing an organic light emitting diode, comprising:
   preparing a substrate;
   forming a scattering layer on the substrate, wherein forming the scattering layer comprises:
     forming fine patterns on the substrate, wherein forming the fine patterns comprises:
       forming a polymer layer on the substrate;
       rearranging the polymer layer into first polymer blocks and second polymer blocks by a phase separation method; and
       removing the first polymer blocks or the second polymer blocks;
     and
     forming a planarization layer covering the fine patterns;
   forming a first electrode layer on the scattering layer;
   forming an organic light emitting layer on the first electrode layer; and
   forming a second electrode layer on the organic light emitting layer.

2. The method of claim 1, wherein the polymer layer includes block copolymer formed by a spin coating method.

3. The method of claim 2, wherein the block copolymer includes at least one of polystyrene-polymethylmethacrylate copolymer, polybutadiene-polybutylmethacrylate copolymer, polybutadiene-polydimethylsiloxane copolymer, polybutadiene-polymethylmethacrylate copolymer, polybutadiene-polyvinylpyridine copolymer, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polyisobutylene-polybutylmethacrylate, polyisobutylene-polydimethylsiloxane, polybutylmethacrylate-polybutylacrylate, polyethylethylene-polymethylmethacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, polyethyleneoxide-polymethylmethacrylate, polyethyleneoxide-polydimethylsiloxane, and polystyrene-polyethyleneoxide.

4. The method of claim 2, wherein the block copolymer is rearranged into the first polymer blocks and the second polymer blocks by a thermal treatment; and
   wherein the phase separation method includes the thermal treatment.

5. The method of claim 1, wherein the first polymer blocks or the second polymer blocks are removed by a cleaning solution after the first and second polymer blocks are exposed by ultraviolet rays.

6. The method of claim 1, wherein forming the fine patterns comprises:
   etching the substrate exposed from the first polymer blocks or the second polymer blocks which remain on the substrate.

7. The method of claim 1, wherein the planarization layer includes at least one of inorganic materials of $TiO_2$, $ZrO_2$, ZnS, $TiO_2$—$SiO_2$, $SnO_2$, and $In_2O_3$, polymers of polyvinyl phenolic resin, epoxy resin, polyimide resin, polystyrene resin, polycarbonate resin, polyethylene resin, polymethylmethacrylate (PMMA) resin, and polypropylene resin, and any combination thereof.

8. The method of claim 1, wherein preparing the substrate comprises:
   forming recesses at a top surface of the substrate.

* * * * *